United States Patent [19]

Yeh

[11] 3,965,433
[45] June 22, 1976

[54] PHASE EQUALIZER USEABLE IN A LIND AMPLIFIER

[75] Inventor: Yu Shuan Yeh, Freehold Township, Monmouth County, N.J.

[73] Assignee: Bell Telephone Laboratories, Incorporated, Murray Hill, N.J.

[22] Filed: Mar. 27, 1975

[21] Appl. No.: 562,572

[52] U.S. Cl. .............................. 328/155; 328/133; 333/18
[51] Int. Cl.² .......................................... H03B 3/04
[58] Field of Search ............... 333/17, 18; 328/155, 328/55, 133; 307/262; 179/15 AE, 15 BS, 15 FD; 330/124

[56] References Cited
UNITED STATES PATENTS
3,436,647 4/1969 Gobeli et al. .................. 328/155 X
3,777,275 12/1973 Cox ...................................... 330/10

Primary Examiner—Paul L. Gensler
Attorney, Agent, or Firm—Daniel D. Dubosky

[57] ABSTRACT

Apparatus for accomplishing phase equalization between two signal components derived from a common source includes circuitry for generating the sum and the difference of the two signal components and for deriving an error signal from the envelopes of the sum and difference. The error signal is mixed in a first mixer with the envelope of the sum signal and mixed in a second mixer with an envelope of an original signal from which the two input signal components to be phase equalized are derived. The output of the first mixer is applied to a phase adjuster which adjusts the phase of one signal component to be phase equalized so that desired phase equality is maintained between the two signal components. The output of the second mixer controls the gain of an amplifier which amplifies the envelope of the original input signal. A particular application of the invention is in a LIND (linear amplification using nonlinear devices) amplifier such as disclosed in U.S. Pat. No. 3,777,275 issued Dec. 4, 1973 to D. C. Cox.

6 Claims, 1 Drawing Figure

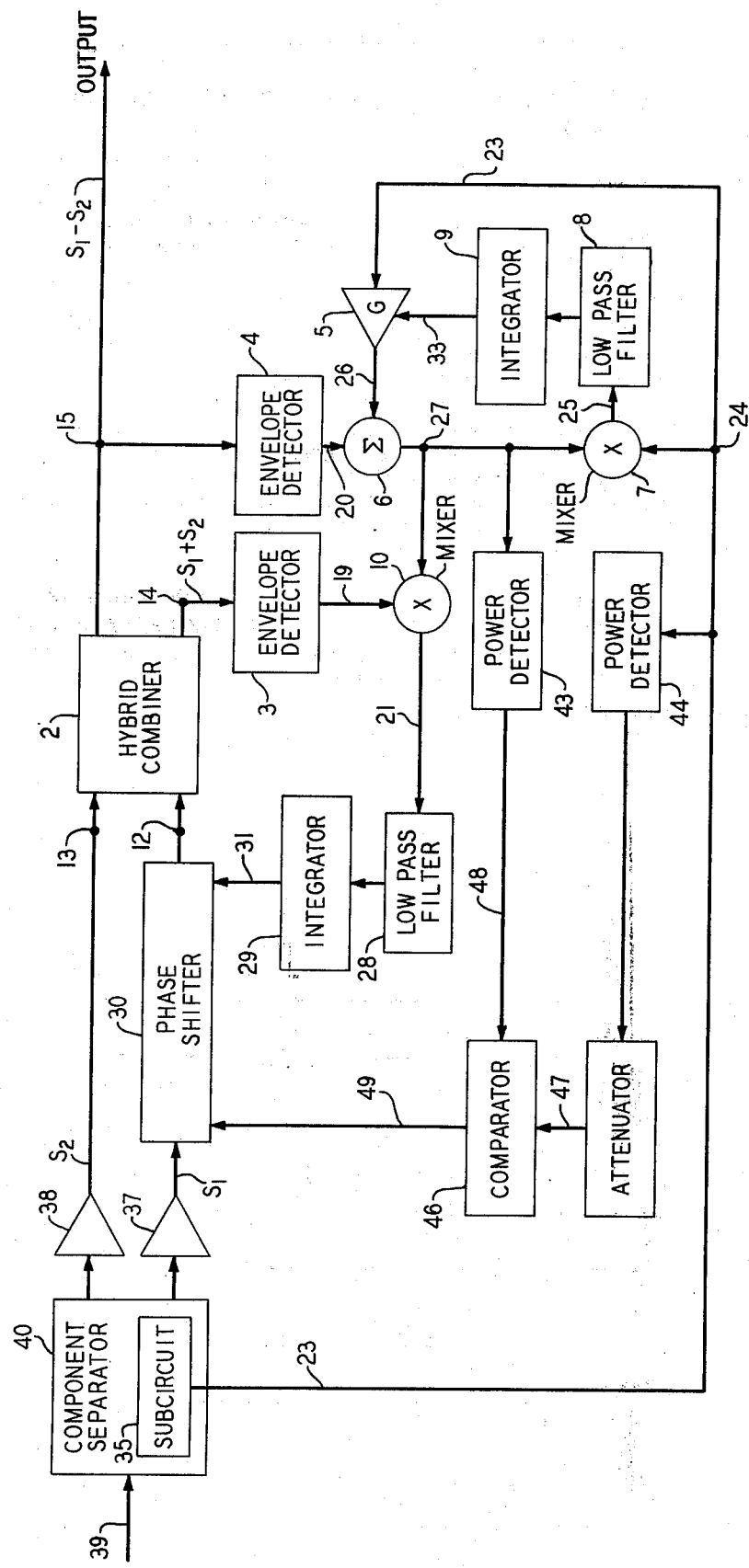

PHASE EQUALIZER USEABLE IN A LIND AMPLIFIER

BACKGROUND OF THE INVENTION

This invention relates to phase equalization circuits and more particularly to improved arrangements for generating error control signals for use in automatic phase equalizers.

In frequency division multiplexers and communications systems having a plurality of signals or signal components, it is frequently necessary for proper system operation to maintain phase equality between the signals or signal components. Because the values of electrical components in such systems drift with time and temperature changes, it is necessary to make adjustments in order to maintain phase equality between signals.

Although the circuit of the invention is applicable in any environment where phase equality between two signals or signal components must be maintained, it is particularly well suited for a LIND (linear amplification using nonlinear devices) amplifier because the circuit selectively equalizes only phase variations associated with drift in value of electrical devices with time and temperature. The circuit of the invention does not affect phase fluctuations of signal components due to desired modulation. In a LIND amplifier, an original bandpass signal to be amplified is separated into two components. These components are separately amplified by nonlinear devices and the amplified resultants recombined to produce a replica of the original bandpass signal. Phase equality between the amplified signal components must be maintained for the LIND amplifier to function properly.

Simple means for detecting and correcting phase differences due only to electrical component drift while leaving desired phase modulation terms unchanged are not available in the prior art. Prior art phase equalizing devices such as phase-locked loops are not suited for use in conjunction with a LIND amplifier because phase-locked loops equalize all phase fluctuations rather than selectively equalize only those fluctuations associated with electrical component drift as required in conjunction with a LIND amplifier.

SUMMARY OF THE INVENTION

In accordance with the present invention, the sum and the difference of two signal components derived from a common source are generated and envelopes of the sum and the difference are detected. The original reference signal from which the two signal components are derived is also envelope detected and the reference signal envelope is amplified. The amplified reference envelope and the envelope of the difference signal are subtracted to produce an error signal. The error signal is mixed with the reference signal envelope to produce an output which controls the gain of the reference signal envelope amplifier. The error signal is also mixed with the envelope of the sum signal to produce an output which is applied to a phase adjuster to adjust the phase of one of two signal components to be phase equalized.

BRIEF DESCRIPTION OF THE DRAWING

The drawing is a block diagram of one possible embodiment of the phase equalizer in accordance with the invention arranged for use in combination with a LIND amplifier.

DETAILED DESCRIPTION

An original input reference signal to be amplified of the general form $E(t)\cos[\omega_o t+\theta(t)]$ is applied via lead 39 to component separator 40 which generates two constant amplitude signals. These two constant amplitude signals are separately amplified by devices 37 and 38 to produce two signals $S_1$ and $S_2$. $S_1$ is a phase modulated input signal of the form $A \sin[\omega_o t+\theta(t)+\phi(t)+\alpha]$ and $S_2$ is a phase inverted version of $S_1$ of the form $A \sin[\omega_o t+\theta(t)-\phi(t)+\beta]$, where $\theta(t)$ is phase modulation, $\alpha$ is a phase variation in $S_1$, $\beta$ is a phase difference between $S_1$ and $S_2$ due to drift of electrical components and $$\sin \phi(t) = E(t) \qquad (1)$$

where $E(t)$ is an amplitude variation. $S_1$ is applied via phase shifter 30 and terminal 12 and $S_2$ is applied via terminal 13, as shown in the drawing, to combining device 2 which may be a hybrid combiner. Combiner 2 produces a sum output $$S_1+S_2 = 2A \cos\left[\phi + \frac{(\alpha-\beta)}{2}\right] \sin\left[\omega_o t+\theta(t)+\frac{(\alpha+\beta)}{2}\right] \qquad (2)$$

at terminal 14 and a difference output $$S_1-S_2 = 2A \sin\left[\phi + \frac{(\alpha-\beta)}{2}\right] \cos\left[\omega_o t+\theta(t)+\frac{(\alpha+\beta)}{2}\right] \qquad (3)$$

at terminal 15. The difference output is an amplified phase shifted replica of the original input signal on lead 39. The sum and difference outputs are applied respectively to envelope detectors 3 and 4 which produce output of the general form $$B(t) = 2A\left|\cos\left[\phi + \frac{(\alpha-\beta)}{2}\right]\right| \qquad (4)$$

and $$A(t) = 2A\left|\sin\left[\phi + \frac{(\alpha-\beta)}{2}\right]\right| \qquad (5)$$

on leads 19 and 20 respectively, where the symbol $|\ |$ means the absolute value of the enclosed quantity. The amplitude variation $E(t)$, which is the envelope of the original reference signal, is detected in subcircuit 35 of component separator 40. Subcircuit 35 separates the original reference signal into two components. One component is the envelope of the reference signal and the other component contains the phase information of the reference signal. Component separator 40 produces the two equal amplitude signals $S_1$ and $S_2$. A more detailed discussion of the subcircuit and the component separator may be found in U.S. Pat. No. 3,777,275 issued Dec. 4, 1973 to D. C. Cox. $E(t)$ is applied via lead 23 to amplifier 5 of gain G to produce a signal $GE(t)$ on lead 26. The signals on leads 20 and 26 are applied to summer 6 which produces at terminal 27 an instantaneous error signal $\epsilon(t)$ of the general form $$\epsilon(t) = A(t) - GE(t)$$

$$= \cdot A \left| \sin \left[ \phi + \frac{(\alpha-\beta)}{2} \right] \right| - G \sin\phi(t). \qquad (6)$$

For $\alpha=\beta$ and $G=2A$ the error signal $\epsilon(t)$ is equal to zero (equation 6) and the signals $S_1$ and $S_2$ are phase equalized.

A nonzero error signal at terminal 27 may be due either to drift in gain G of amplifier 5 or to an undesired phase shift in either signal $S_1$ or $S_2$. In order to determine whether the gain G of amplifier 5 or the phase of shifter 30 should be changed, the error signal is correlated in mixer 7 with $E(t)$ and correlated in mixer 10 with the envelope on lead 19 of $S_1+S_2$.

The signals at terminals 27 and 24 are applied to mixer 7 which produces on lead 25 a product signal of the form $$\sin\phi \left| \sin \left[ \phi + \frac{(\alpha-\beta)}{2} \right] \right| - G \sin^2\phi.$$

This product signal is applied to low-pass filter 8 which produces an averaged output applied as an input to integrator 9. The output of integrator 9 is applied to amplifier 5 via lead 33 to control its gain in accordance with $$G = G_o + K_1 \int_o^t <\epsilon(t)E(t)>dt \qquad (7)$$

where the symbol $< >$ means the time average of the enclosed quantity, $G_0=2A$ is the initial setting of the amplifier gain and $K_1$ is a constant which controls the response time of the loop consisting of summer 6, mixer 7, low-pass filter 8, integrator 9 and amplifier 5. $K_1$ is a constant, analogous to a gain constant, associated with integrator 9 and chosen so that the time constant of the associated loop is on the order of seconds. The gain of amplifier 5 is varied so that the average power (the mean square value) associated with the error signal output of summer 6 decreases.

The error signal at terminal 27 and the signal on lead 19 are applied to mixer 10 which produces a product signal output of the form $$\left[ \left| \cos \left[ \phi + \frac{(\alpha-\beta)}{2} \right] \right| \left[ \left| \sin \left[ \phi + \frac{(\alpha-\beta)}{2} \right] \right| - G \sin\phi \right] \right] \text{ on lead 21.}$$

This product signal is applied to low-pass filter 28 and the output of this filter is applied as an input to integrator 29 which produces as its output on lead 31 a signal of the general form $$\alpha = \alpha_o - K_2 \int_o^t <\epsilon(t)B(t)>dt \qquad (8)$$

where $\alpha_o$ is the initial phase setting of phase shifter 30 and $K_2$ is a gain constant which controls the response time of the loop consisting of combiner 2, envelope detector 3, mixer 10, filter 28, integrator 29 and shifter 30. $K_2$ is associated with integrator 29 and is chosen so that the time constant of the associated loop is on the order of seconds. The signal on lead 31 controls the phase of signal $S_1$ via phase shifter 30 so that the phase of $S_1$ is varied to decrease the average power associated with the instantaneous error signal $\epsilon(t)$.

Since the magnitudes of the gain controlling signal applied to amplifier 5 via lead 33 and the phase controlling signal applied to phase shifter 30 via lead 31 depend on the value of the error signal $\epsilon(t)$ which in turn depends on the phase difference between $S_1$ and $S_2$, the phase equalizer is self-adjusting. Accordingly, phase equality between signals $S_1$ and $S_2$ is maintained.

The operation of the phase equalization circuit has been discussed above in terms of correlation. The circuit operation may be understood in greater detail by examination of gradient functions. As noted above, if $\alpha$ is not equal to $\beta$, a nonzero error signal is produced and the phase equalization circuit operates to make $\alpha$ equal to $\beta$, thereby driving the error signal toward zero. $\epsilon(t)$ is driven toward zero by adjusting G and $\alpha$ in the direction of reducing the mean square value of $\epsilon(t)$ to zero. The mean square values of G and $\alpha$ are adjusted according to the gradient equations $$\frac{dG}{dt} = -\frac{\delta<\epsilon^2>}{\delta G} = -2<\epsilon(t)E(t)> \qquad (9)$$

$$\frac{\delta\alpha}{\delta t} = -\frac{\delta<\epsilon^2>}{\delta\alpha} = <\epsilon B(t) \text{sgn} \left[ \sin \left[ 2\phi + \frac{(\alpha-\beta)}{2} \right] \right] > \qquad (10)$$

where the symbol sgn means the algebraic sign of the following quantity. Equation (10) cannot be conveniently implemented by circuitry. Since $$\sin \left[ 2\phi + \frac{(\alpha-\beta)}{2} \right]$$

is almost always positive, equation (10) can be approximated by $$\frac{\delta<\epsilon^2>}{\delta\alpha} = <\epsilon B(t)>. \qquad (11)$$

Equation (11) can be realized conveniently by the loop consisting of mixer 10, filter 28, integrator 29, phase shifter 30, combiner 2 and envelope detector 3. Equation (9) can be realized by the loop comprising mixers 6 and 7, filter 8, integrator 9 and amplifier 5 and therefore requires no approximation. G and $\alpha$ are then adjusted by the outputs of integrators 9 and 29, respectively, according to $$\frac{dG}{dt} = -\frac{K_1}{2} \frac{\delta<\epsilon^2>}{\delta G} = K_1<\epsilon(t)E(t)> \qquad (12)$$

and $$\frac{d\alpha}{dt} = -K_2 \frac{\delta<\epsilon^2>}{\delta\alpha} = -K_2<\epsilon(t)B(t)> \qquad (13)$$

respectively, where $K_1$ and $K_2$ are the constants associated with integrators 9 and 29, respectively. A stable state is reached when the two gradient functions of equations (12) and (13) each equal zero. The circuitry is able to drive the gradients to zero if $\alpha$ is nearly equal to $\beta$ assuming an initial coarse alignment of the signals $S_1$ and $S_2$. When the gradients each equal zero, G=2K and $\alpha=\beta$.

If, however, $\alpha$ is not initially nearly equal to $\beta$ (without coarse adjustment), the circuitry will still drive the gradients of equations (12) and (13) to zero. However, an undesirable stable state in which $\alpha=\beta+\pi$ may result. In order for the circuitry to operate in the desired stable state in which $\alpha=\beta$, a phase shift of $\pi$ must be inserted in $\alpha$ so that an operating condition in which $\alpha=\beta$ can be obtained. Comparator 46 determines the need to insert a phase shift of $\pi$ in $\alpha$ by comparing the mean square value of $\epsilon(t)$ on lead 48 with an attenuated version on lead 47 of the mean square value of $E(t)$. If the former exceeds the latter by a predetermined level, a $\pi$ phase shift can be added to $\alpha$ to bring the circuit into alignment and into the desired state of operation. Power detectors 43 and 44 detect the mean square values of $\epsilon(t)$ and $E(t)$ respectively. The output of the comparator is applied via lead 49 to phase shifter 30 to cause a $\pi$ phase shift in $\alpha$.

When $\alpha$ equals $\beta$ the envelope of the right side of equation (3) equals $2KE(t)$ and the amplitude of the LIND output envelope is distortionless. In addition, for $\alpha=\beta$, the phase of the LIND output is $(\omega_o t+\theta(t)+\alpha)$. Since $\alpha$ is merely a constant phase shift associated with any linear amplifier, the phase of the LIND output is distortionless.

In all cases it is to be understood that the above-described arrangements are merely illustrative of a small number of the many possible applications of the principles of the invention. Numerous and varied other arrangements in accordance with these principles may readily be devised by those skilled in the art without departing from the spirit and scope of the invention.

What is claimed is:

1. Apparatus for equalizing the phase of two signal components originally derived from a common source, said components appearing in separate paths comprising:

a combining device to which said two signal components to be phase equalized are applied and from which two outputs emanate, one output being the difference of said two signal components and the other output being the sum of said two signal components applied to said combining device;

first means for detecting the envelope of the difference output from said combining device;

second means for detecting the envelope of the summed output from said combining device;

a variable gain amplifier;

means for applying the envelope of a reference signal from which said two signal components are derived to said variable gain amplifier, the reference signal being derived from said common source;

means for summing the output of said variable gain amplifier and the envelope of the difference output to produce an instantaneous error signal;

a first means for correlating the instantaneous error signal with the envelope of the reference signal to produce a first signal;

means for applying the first signal to said variable gain amplifier to control the gain of said amplifier;

a second means for correlating the instantaneous error signal with the envelope of the summed output of said combining device to produce a second signal;

a phase shifter inserted in the path of one of said two signal components; and means for applying the second signal to said phase shifter controlling the phase of the one of said two signal components.

2. Apparatus as described in claim 1 wherein said first means for correlating is a first mixer to which the instantaneous error signal and the envelope of the reference signal are applied and said second means for correlating is a second mixer to which the instantaneous error signal and the envelope of summed output of said combining device are applied.

3. Apparatus for equalizing the phase of two signal components as described in claim 1 wherein said apparatus further includes:

means responsive to the instantaneous error signal and the envelope of the reference signal for controlling said phase shifter so as to shift the phase of one of said two signal components $\pi$ radians.

4. Apparatus as described in claim 3 wherein said means responsive to the instantaneous error signal and the envelope of the reference signal includes:

means for detecting the power level associated with the instantaneous error signal;

means for detecting the power level associated with the envelope of the reference signal; and means for comparing the detected power levels, said means for comparing producing an output applied to said phase shifter to shift the phase of one of said two signal components by $\pi$ radians when the difference between the detected power levels exceeds a predetermined level.

5. In combination, a component separator responsive to an input signal for producing two signal components and for producing an envelope of the input signal, a hybrid device for combining the two signal components to produce two output signals, a phase shifter inserted in the path of one of the two signal components between said component separator and said hybrid device, and means responsive to the two output signals and to the envelope of the input signal for controlling said phase shifter.

6. A linear amplifier of the type having a component separator for producing from an input signal two signal components and the envelope of said input signal, a combining device for combining said two signal components to produce two output signals one of which is a linearly amplified replica of said input signal, wherein the improvement comprises:

a phase shifter inserted in the path of one of the two signal components between said component separator and said combining device; and means responsive to the two ouput signals and to the envelope of the input signal for controlling said phase shifter.

* * * * *